(12) United States Patent
Hsieh

(10) Patent No.: US 7,118,968 B2
(45) Date of Patent: Oct. 10, 2006

(54) METHOD FOR MANUFACTURING INTERPOLY DIELECTRIC

(75) Inventor: Jung-Yu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/919,921

(22) Filed: Aug. 17, 2004

(65) Prior Publication Data

US 2006/0040446 A1    Feb. 23, 2006

(51) Int. Cl.
    *H01L 21/8247*   (2006.01)
(52) U.S. Cl. ........................ 438/261; 438/762
(58) Field of Classification Search ........ 438/257–267, 438/762–763
    See application file for complete search history.

(56) References Cited

U.S. PATENT DOCUMENTS

| | | | |
|---|---|---|---|
| 5,243,559 A | 9/1993 | Murai | |
| 6,136,647 A | 10/2000 | Sung | |
| 6,162,684 A | 12/2000 | Chang et al. | |
| 6,355,522 B1 | 3/2002 | Chang et al. | |
| 6,395,654 B1 | 5/2002 | Yang et al. | |
| 6,512,264 B1 | 1/2003 | Ogle, Jr. et al. | |
| 6,602,792 B1 | 8/2003 | Hsu | |
| 6,642,573 B1 | 11/2003 | Halliyal et al. | |
| 6,674,138 B1 * | 1/2004 | Halliyal et al. | 257/411 |
| 2003/0017670 A1* | 1/2003 | Luoh et al. | 438/257 |
| 2003/0047775 A1* | 3/2003 | Fujimoto et al. | 257/314 |
| 2003/0064564 A1 | 4/2003 | Lin | |
| 2004/0166632 A1* | 8/2004 | Jeng et al. | 438/261 |

* cited by examiner

*Primary Examiner*—Richard A. Booth
(74) *Attorney, Agent, or Firm*—Joseph E. Root; Haynes Beffel & Wolfeld LLP

(57) ABSTRACT

Roughly described, a floating gate memory cell is fabricated by forming an oxide-nitride dielectric layer above a floating gate of the memory cell and in an oxide growth region not above a floating gate. The nitride layer is removed in the oxide growth region using a mask that protects the nitride layer above the floating gate, and then the bottom oxide layer is removed in the oxide growth region using a wet etch that does not affect the nitride remaining above the floating gate. First and second oxide layers are then formed both above the floating gate and in the oxide growth region, to act as the top layer of ONO above the floating gate and as the gate oxide in the oxide growth region. One of the first and second oxide layers is formed using in-situ steam generation.

11 Claims, 6 Drawing Sheets

METHOD FOR MANUFACTURING INTERPOLY DIELECTRIC

BACKGROUND

1. Field of the Invention

The invention relates to the formation of interpoly dielectric in flash and other floating-gate-based memory, and more particularly to the use of an in-situ steam generation (ISSG) procedure in the formation of a first oxide layer.

2. Description of Related Art

Read only memory (ROM) is a memory device that contains fixed data patterns determined at the time of fabrication. In the fabrication of a ROM, it is necessary to make a storage cell that maintains data after the applied power is turned off. Because data to be stored in a ROM is predetermined prior to fabrication, the change of a single bit in the stored data would require an alteration of the entire circuit and the manufacturing process.

To avoid having to custom design each ROM from scratch, ROMs are often manufactured using a process known as mask programming, by which data is stored in the ROM at one of the final process steps. A ROM made this way is called a mask ROM because the programming in the device is carried out by means of the mask at one of the final process steps, typically a metal layer.

Although mask ROM is more flexible than conventional ROMs, data must still be stored in the device during fabrication. In this regard, programmable read only memory (PROM) is a further improvement to the mask ROM. Data can be electrically programmed in a PROM device by the user. However, a PROM cell can be programmed only once.

A still further improvement to mask ROM and PROM is an EPROM, or erasable programmable ROM. A typical EPROM is shown in FIG. 1A, where a floating gate 12 is located between a control gate 14 and a substrate 10. An isolation region 16 surrounds both the floating gate 12 and the control gate 14. The isolation region includes a bottom oxide layer 110 between the floating gate 12 and the substrate 10, and a gate oxide layer 112 between the floating gate 12 and the control gate 14. Note that an EPROM cell is structurally similar to an NMOS device, except that the former has two gate conductors and no LDD (lightly doped drain) region.

The contacts of the source 13 and the substrate 10 of an EPROM are both coupled to ground, whereas the control gate 14 and the contact of the drain 15 are connected to high potentials $V_G$ and $V_D$, respectively. The control gate 14 is reverse-biased with respect to the drain 15. Because the drain 15 is not protected by an LDD structure, the PN junction of an n-doped drain 15 and a p-doped substrate 10 will foster the well-known carrier multiplication effect. Some of the hot electrons produced as a result of this effect will be collected by the drain 15, while the rest of them will transverse through the isolation region 16 and be trapped in the floating gate 12. The voltage supplied to the control gate 14 and the drain 15 are switched off as soon as these hot electrons are trapped in the floating gate 12. The electrons trapped in the floating gate do not have enough energy to escape because of the potential barrier in the isolation region 16 surrounding the floating gate 12. As a consequence, the data may be stored in the floating gate 12 for years.

The electric charges in the floating gate 12 determine the value stored in the memory cell. If no electric charge is stored at the floating gate 12, the floating gate 12 will have no influence on the electrical field that control gate 14 generates in the channel region between the source 13 and drain 15. However, if the floating gate 12 is charged with electrons, the electric charges in the floating gate 12 will shield the field of the control gate 14 and generate an electrical field in the channel region; this second electrical field is opposite in sign to the field of the active control gate 14. Thus, a small active signal at the control gate 14 cannot generate a sufficiently strong field to turn on the transistor. Only with a much higher control gate potential can the storage transistor be turned on; i.e., the field of the control gate 14 must be strong enough to compensate the field of the floating gate 12 and to make the channel between source 13 and drain 15 conductive.

Referring again to FIG. 1A, an EPROM can be programmed by loading the floating gate 12 with electrons. The stored data may be erased by exposure to ultraviolet (UV) radiation for a certain period of time. Essentially, the electrons trapped in the floating gate 12 absorb sufficient energy from the UV light and escape from the floating gate 12 in the same way as they were previously trapped. An EPROM with an empty floating gate 12 may be reprogrammed again in accordance with the above-described programming process.

Because the electric charges in the EPROM can only be erased with ultraviolet radiation, it is necessary for the packaging of an EPROM to have a window made of, e.g., quartz glass, to allow the die to be exposed to ultraviolet radiation. This results in an increase in the manufacturing cost. Furthermore, all the electric charges (and hence any data or program) in the device are erased all at once, dictating a time-consuming reprogramming process. These concerns can be overcome by using an electrically erasable programmable read-only memory (EEPROM), where the electric charges in the floating gate 12 can be electrically erased. As shown in FIG. 1B, EEPROM is programmed in the same way as the EPROM, i.e., through hot electron ejection generated by a relatively long voltage pulse between the control gate 14 and the drain 15. In this process, electrons generated in the drain 15 traverse through an oxide layer 18 into the floating gate 12. This is the well-known Fowler-Nordheim tunneling mechanism, and the bottom oxide layer 18 is known as tunneling oxide layer. In the case where both the floating gate 12 and the control gate 14 are made of polysilicon, the gate oxide layer 112 is sometimes called an interpoly dielectric. The interpoly dielectric need not be strictly an oxide; often it is made of an oxide-nitride-oxide (ONO) composite.

To erase an EEPROM, an inverse voltage is applied between the control gate 14 and the drain 15. As a result, electrons in the floating gate 12 travel to the drain 15 again through the tunneling oxide layer 18. The stored data is erased accordingly; new data can be programmed into the memory cell again. Because the inverse voltage is applied to each pair of the control gate 14 and the drain 15, each gate can be erased independent of other gates. This allows bit-by-bit erasure and reprogramming of the EEPROM cell, a significant improvement over the aforementioned EPROM cell.

A more recent type of memory cell is the flash EPROM cell, which is often used as a substitute for floppy disk or hard disk drives. This is because flash memory may be programmed as flexibly as a random access memory (RAM). The structure of flash memory cells is similar to that of EEPROMs, except that the tunneling oxide layer 18 is often made thinner than that in an EEPROM memory cell, allowing lower programming and erasure voltages applied between the control gate 14 and the drain 15; see FIG. 1A. Flash memories also typically have simplified array structures, improving speed and density but permitting erasure only in a block-by-block manner.

Many varieties of floating gate memories have been developed in addition to those described above, including twin bit or split cell memories, memories which use conductive material (e.g. polysilicon) as the floating gate, and memories which use dielectric material (e.g. silicon nitride within an ONO composite) as the floating gate.

Data storage in all these variations is accomplished by trapping hot electrons or Fowler-Nordheim tunneling electrons in a floating gate. Therefore, it is vitally important to control the thickness of the gate dielectric layer and the tunneling oxide layer between the floating gate and the semiconductor substrate.

Typical conventional methods for controlling the thickness of the gate oxide or tunneling oxide layer are depicted as follows. As shown in FIG. 2A, after a floating gate 12 is fabricated, an interpoly dielectric layer is formed on the floating gate 12. This interpoly dielectric layer is a composite of oxide-nitride-oxide (ONO) dielectric materials, including a bottom silicon oxide layer 22, a silicon nitride layer 24, and a top silicon oxide layer 26; all three layers are deposited typically via a chemical vapor deposition (CVD) process. The conventional bottom oxide layer 22 is usually grown to a thickness between 20 to 40 nm; the nitride layer 24 may be anywhere between 10 to 25 nm; and the top oxide layer 26 is usually limited to approximately 3 to 4 nm.

Because a gate oxide layer must be grown in the peripheral area after forming the oxide-nitride-oxide composite structure, the interpoly dielectric layer in the peripheral area must be removed before the oxidizing process. Since it is difficult to grow a gate oxide layer on the silicon nitride layer 24, the conventional process dictates that certain portions of the silicon nitride layer 24 of the ONO interpoly dielectric in the peripheral area be completely removed before growing the gate oxide. Several conventional methods may be used to accomplish this goal.

One method for removing selected portions of the ONO dielectric is shown in FIG. 2B, where the top oxide layer 26 and the silicon nitride layer 24 over a gate oxide growth region 28 are removed via a dry etch process using $CF_4$ as the etchant. Because the etch rate in the bottom oxide is relatively low, the dry etch process stops within the bottom oxide layer 22. Next, a gate oxide layer 30 is formed on the bottom oxide layer 22 through a thermal oxidation process; see FIG. 2C. The thickness of the remaining bottom oxide layer 22 is an important factor in this method. If the thickness of the remaining bottom oxide layer 22 cannot be ascertained, it will be difficult to control the thickness of the gate oxide layer that is subsequently grown. On the other hand, it is not advisable to etch away all of the remaining bottom oxide 22 with hydrofluoric acid, because the photoresist film 32 (shown in FIG. 2B) cannot be used as a shield to the hydrofluoric acid; the ONO structure on top of the floating gate 21 will also be etched. Using the buffered oxide etch (BOE) process does not solve this problem, either, because the field oxide region 34 will be etched at a greater etch rate, causing deterioration of the isolation region between the gates.

A second method for removing selected portions of the ONO dielectric is depicted in FIG. 2D, in which a dry etch process (using $CF_4$ as the etchant) is used to remove the entire ONO structure from the gate oxide growth region 28. This etch process stops at the substrate 10. Next, as is illustrated in FIG. 2E, a gate oxide layer 36 is formed on the gate oxide growing region 28 via a thermal oxidation process. This method requires that the dry etchants be able to etch silicon dioxide but not silicon; otherwise, the silicon substrate would also be etched, resulting in adverse effects such as gate oxide quality degradation.

In U.S. Pat. No. 6,136,647, ONO was used as the interpoly dielectric layer in a floating gate memory structure. But in order to facilitate removal of the nitride sub-layer before growing the gate oxide, the interpoly dielectric was formed initially to include only an oxide-nitride (ON) composite layer instead of the full ONO layer. The portion of the ON layer over the gate oxide growth region was then removed. The removal of such an ON film was said to cause much less damage to the substrate compared to the conventional case of the ONO film. After the removal process, a thermal oxidation process and an oxide CVD process were used to grow the gate oxide and the top oxide of the ONO layer simultaneously. This process was said to provide better assurance of the quality of the gate oxide and the ONO interpoly dielectric layers.

However, thermal oxidation processes and oxide CVD processes can sometimes create significant stresses within the oxide layer. The large stresses often create defects in nearby active regions, which can result in leakage current and degrade reliability. The insulation between the two gates can degrade, and word-line to word-line shorts can occur.

Accordingly, it is an object of the present invention to provide a method for fabricating a memory device that avoids the drawbacks of the conventional methods.

SUMMARY OF THE INVENTION

According to the invention, roughly described, a floating gate memory cell is fabricated by forming an oxide-nitride dielectric layer above a floating gate of the memory cell and in an oxide growth region not above a floating gate. The nitride layer is removed in the oxide growth region using a mask that protects the nitride layer above the floating gate, and then the bottom oxide layer is removed in the oxide growth region using a wet etch that does not affect the nitride remaining above the floating gate. First and second oxide layers are then formed both above the floating gate and in the oxide growth region, to act as the top layer of ONO above the floating gate and as the gate oxide in the oxide growth region. One of the first and second oxide layers is formed using in-situ steam generation.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Moreover, it is to be understood and appreciated that the process steps and structures described herein do not describe a complete process flow for the manufacture of an integrated circuit. The invention may be practiced in conjunction with various integrated circuit fabrication techniques that are conventionally used in the art, or that are hereafter developed, and only so much of the commonly practiced process steps are included herein as are necessary to provide an understanding of the invention.

Figure 1A:
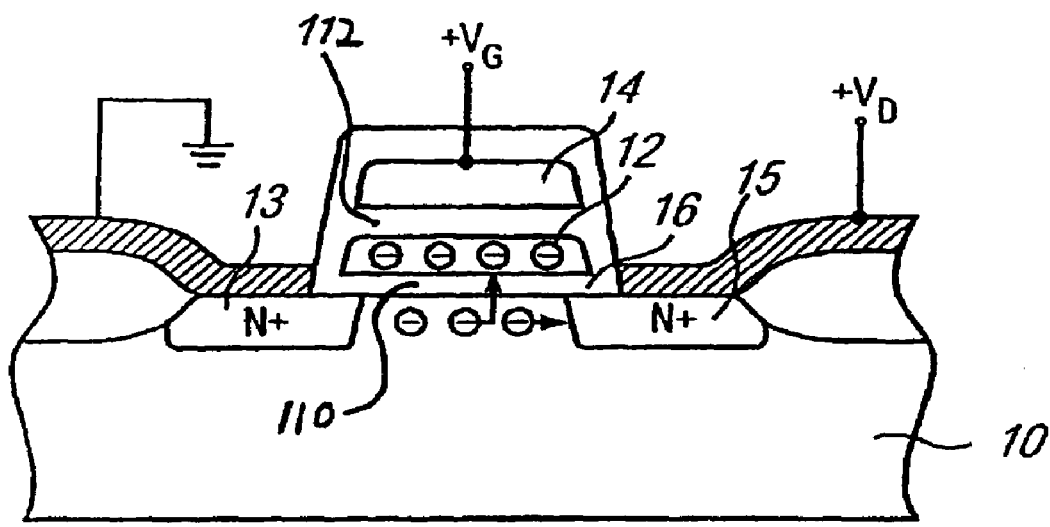
FIGS. 1A and 1B are cross-sectional views of prior-art memory cells.
Figure 1B:
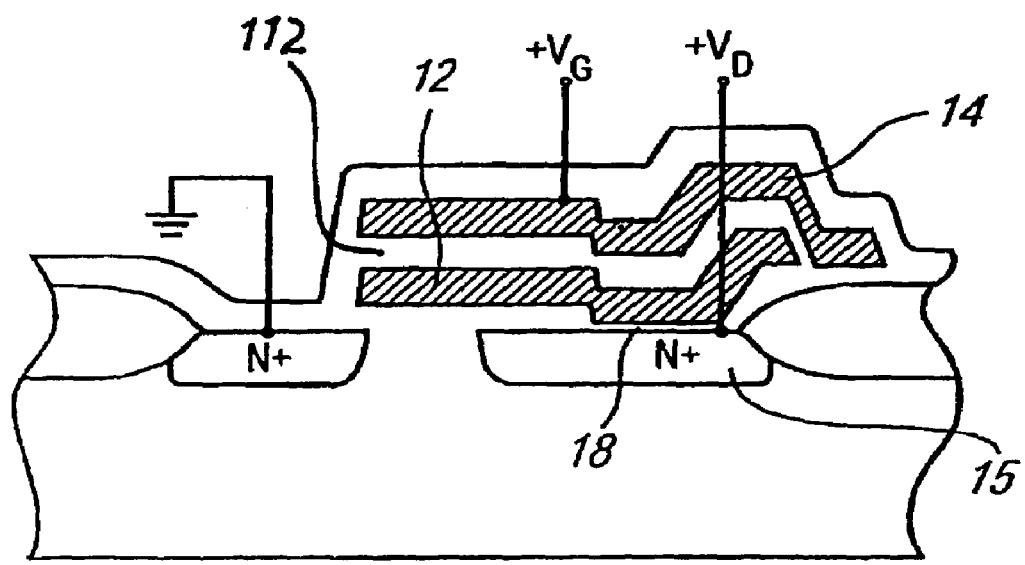
Figure 2A:
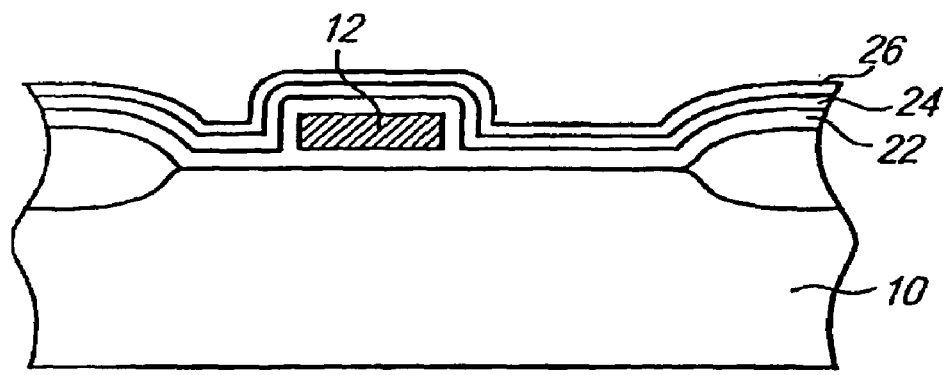
FIGS. 2A, 2B, 2C, 2D and 2E are cross-sectional views illustrating a prior-art method for fabricating a floating gate memory cell.
Figure 2B:
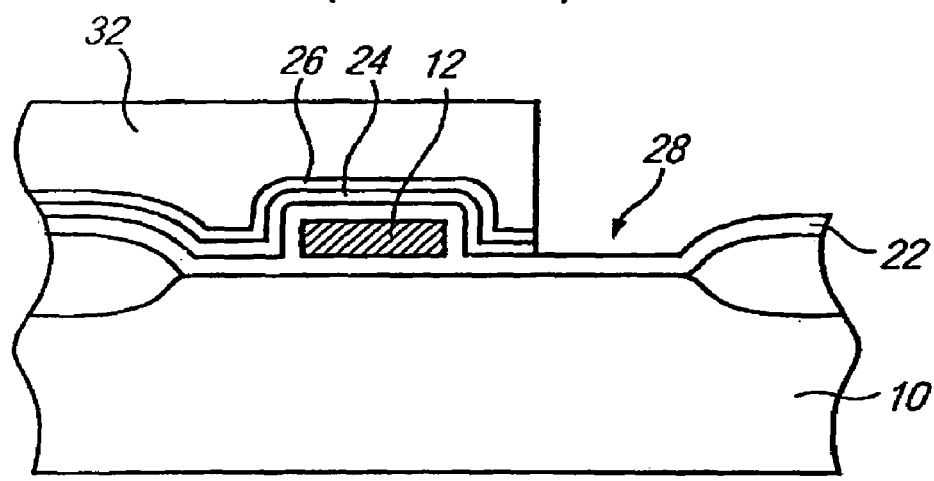
Figure 2C:
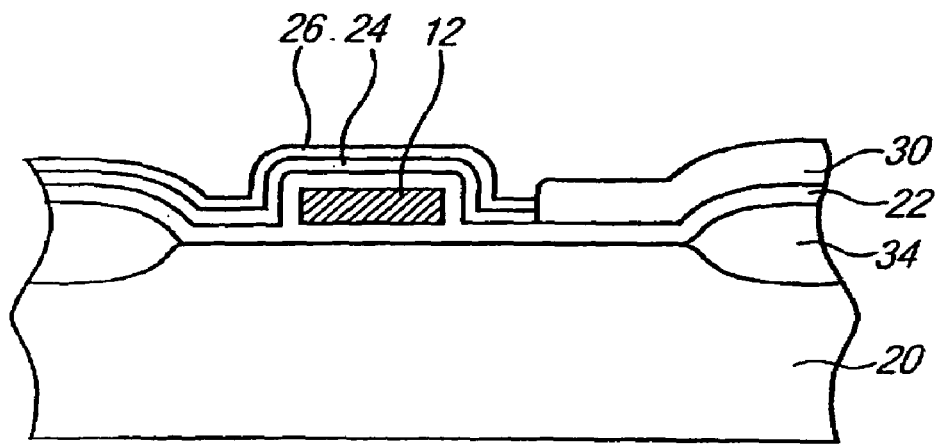
Figure 2D:
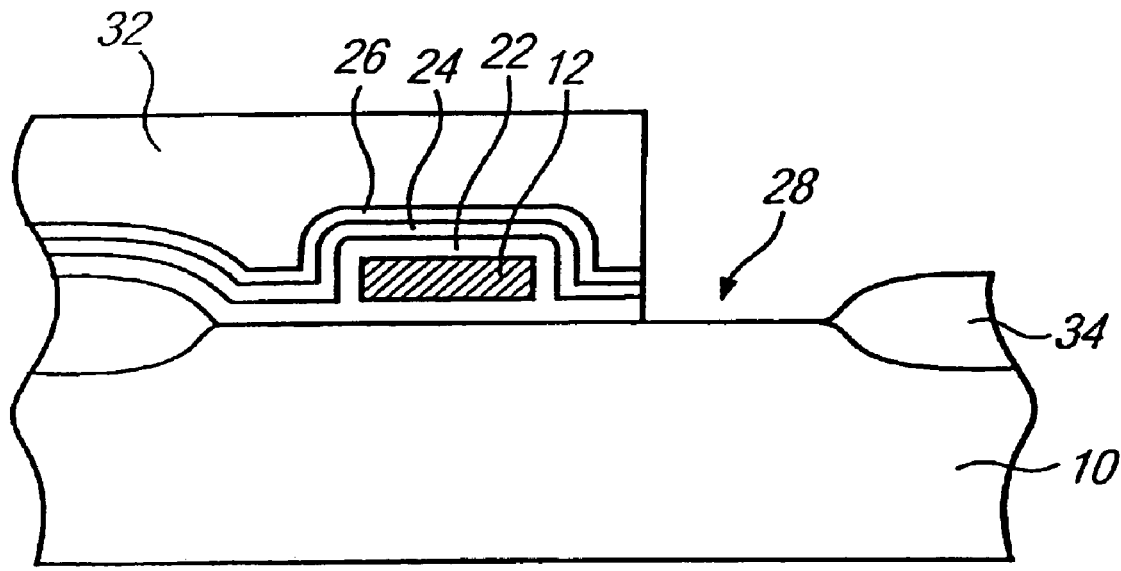
Figure 2E:
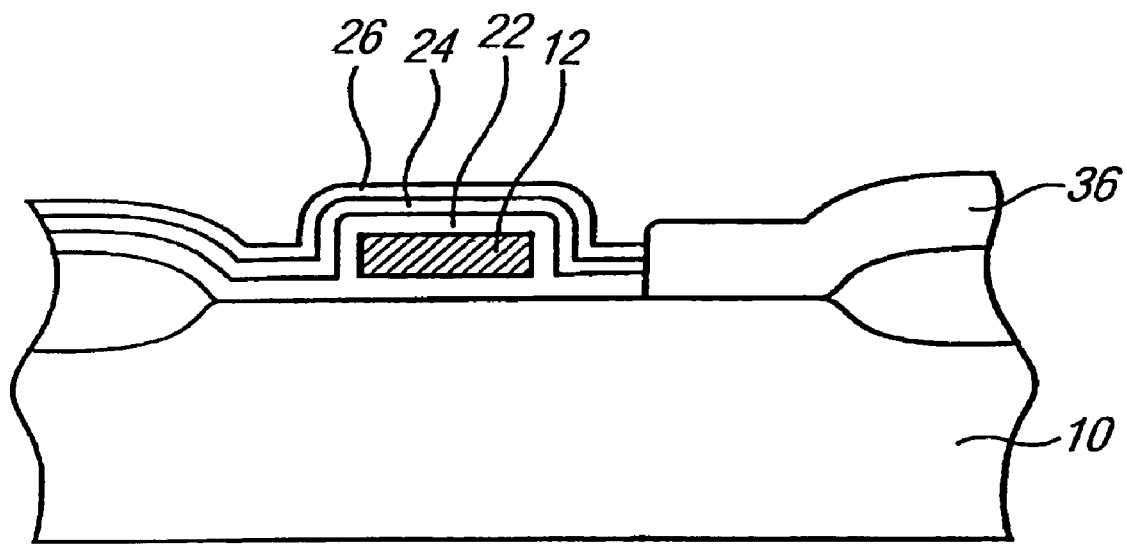
Figure 3A:
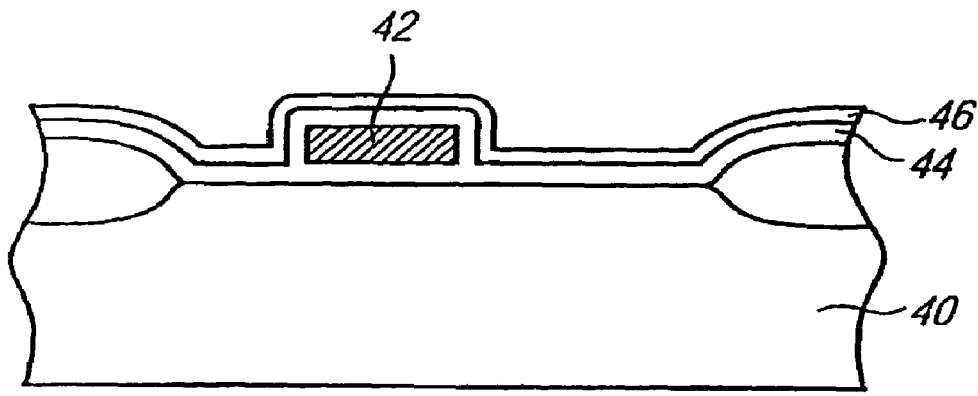
FIG. 3A is a cross-sectional view of a memory cell embodiment of the present invention after formation of a composite oxide-nitride interpoly dielectric layer on a floating gate.

FIG. 3A is a cross-sectional view of a memory cell after formation of a composite oxide-nitride interpoly dielectric layer on a floating gate. In the embodiment of FIG. 3A, the interpoly dielectric layer is formed via a CVD process over a floating gate 42 which is in turn fabricated over a substrate 40. The interpoly layer is a composite oxide-nitride (ON) dielectric layer having a bottom silicon dioxide layer 44 and a silicon nitride layer 46. Unlike a conventional ONO structure, this structure does not have a top oxide layer. The bottom oxide layer 44 may be approximately 30–50 Angstrom thick, while the silicon nitride layer 46 is approximately 80–150 Angstrom thick.

Figure 3B:
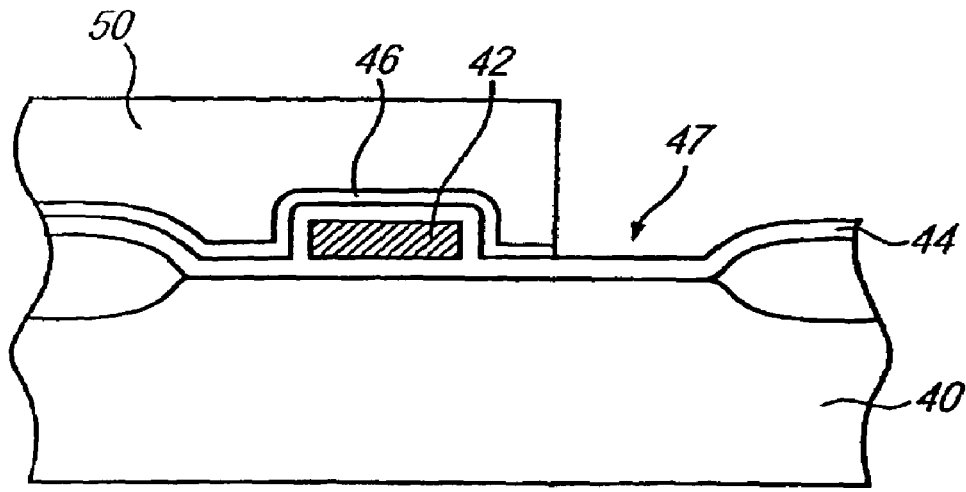
FIG. 3B is a cross-sectional view of a memory cell embodiment of the present invention after etching of nitride of the oxide-nitride dielectric layer in the gate oxide growth region.
Figure 3C:
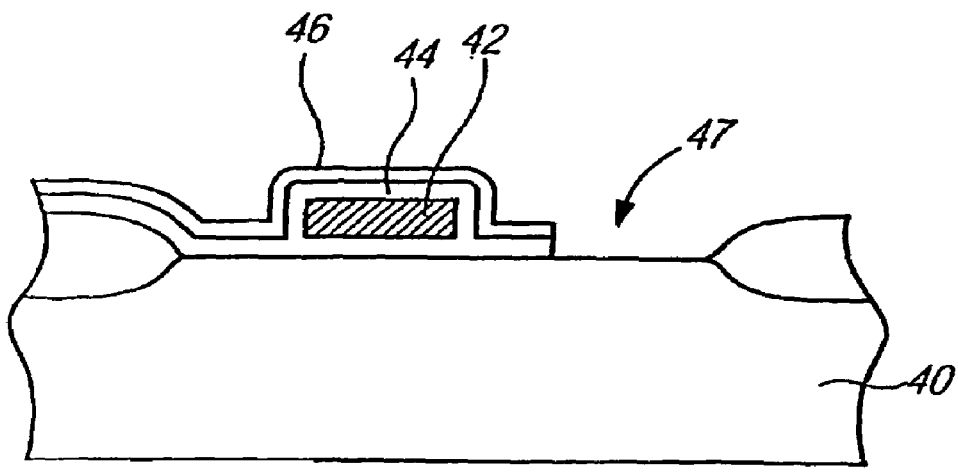
FIG. 3C is a cross-sectional view of a memory cell embodiment of the present invention after removal of the bottom oxide of the oxide-nitride dielectric layer in the gate oxide growth region.

Because it is difficult to grow a gate oxide on the nitride layer 46, it is desirable to remove the nitride layer 46 before growing the gate oxide. Before the removal of the nitride layer 46, a gate oxide growth region 47 is defined by coating and patterning a photoresist 50 covering part of the substrate 40; see FIG. 3B. The undesired portion of the top nitride layer 46 is then removed via a dry etching technique, using the photoresist 50 as a mask. The dry etching process should have a high nitride etch rate and a low oxide etch rate. As a result, the nitride layer will be completely removed in the oxide growth region before the silicon substrate is damaged by the dry etching process. After the nitride layer 46 is removed, the entire structure is wet-etched by dipping in hydrofluoric acid or BOE to remove the portion of the exposed bottom oxide 44 that is not protected by the overlaying nitride layer 46; see FIG. 3C. The structure is then cleaned using SC1 solution ($NH_4HOH_2O_2$) or HF. Following this step, one of the two methods described below may be used to grow the gate oxide layer and the top oxide layer of the interpoly dielectric layer.

Figure 3D:
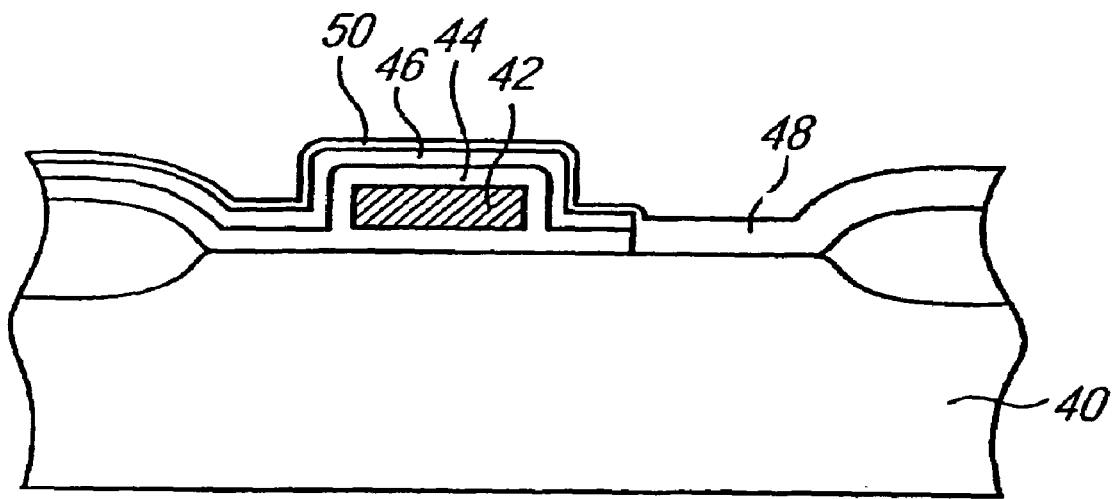
FIG. 3D is a cross-sectional view of a memory cell embodiment of the present invention after formation of a first gate oxide layer.

In one embodiment, as illustrated in FIG. 3D, a first gate oxide layer 48 is formed on the substrate 40, preferably via an in-situ steam generation (ISSG) process. A very thin layer of silicon dioxide 50 is also formed on the nitride layer 46 of the oxide-nitride interpoly dielectric composite during this process step, recovering from any RIE damage and isolating the cap nitride of the ON composite layer. Above the floating gate, this first oxide layer 48 has a thickness of approximately 1–10 Angstrom. In the oxide growth region, it has a thickness of approximately 60–100 Angstrom.

Figure 3E:
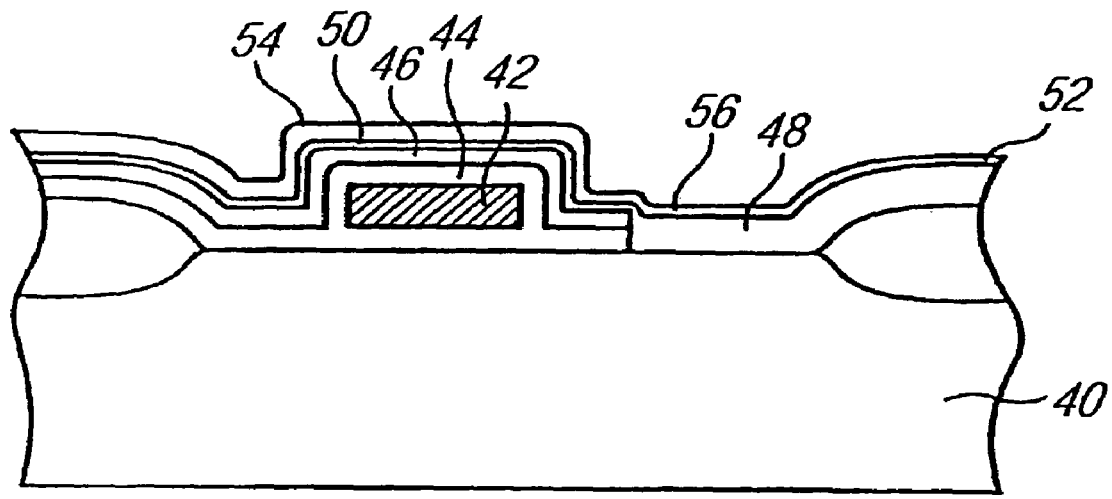
FIG. 3E is a cross-sectional view of the memory cell embodiment of FIG. 3D after simultaneous formation of a second gate oxide layer and a top oxide on the oxide-nitride dielectric layer.

The ISSG-formed oxide layer 48 over the nitride layer also forms an oxide base for the next step, in which as is shown in FIG. 3E, a silicon dioxide layer 52 is deposited via a thermal oxidation process over the thin silicon dioxide layer 50 and the first gate oxide layer 48. The silicon dioxide layer 52 in effect serves as both a second gate oxide layer 56, and second top oxide layer 54 of what is now an oxide-nitride-oxide dielectric structure over the floating gate. This silicon dioxide layer 52 is approximately 40–80 Angstrom thick above the floating gate, and approximately 120–170 Angstrom thick in the oxide growth region. The use of two oxide layers 48 and 56 helps to better control the gate oxide thickness. The entire substrate 40 is then annealed at 850 C–950 C to generate high quality gate oxide layers with improved mobility, high dielectric constant, low gate oxide dopants, and a high breakdown voltage.

The ISSG process step is performed in a conventional furnace, but is preferably performed in a rapid thermal annealing (RTA) chamber and specifically in a single wafer RTA chamber. An example such furnace is a Centura RTM 5000 system marketed by the Applied Materials Corporation. The device is annealed and oxidized in an atmosphere comprising oxygen and hydroxyl and at a temperature betweeh about 700 C to about 1200 C, and preferably between about 900 C–1000 C. At these temperatures the oxygen reacts with the hydroxyl to form a steam-containing atmosphere adjacent to the wafer. The flow rate of oxygen is from about 1 sccm (Standard Cubic Centimeter per Minute) to about 30 sccm, and the flow rate of hydrogen is from about 0.1 sccm to about 15 sccm. The annealing time of this ISSG process is about 50–300 seconds.

A second embodiment is the same as the first, except that the first gate oxide layer 48 in FIG. 3D is formed by thermal oxidation and the second gate oxide layer 56 is formed by ISSG.

ISSG is used to form one of the oxide layers both because the quality of the resulting oxide is such that the oxide breakdown voltage is better than that of oxides produced by a CVD process as in the prior art, and also because the resulting oxide has less interfacial stress than that of oxides produced by a CVD process as in the prior art.

Figure 4:
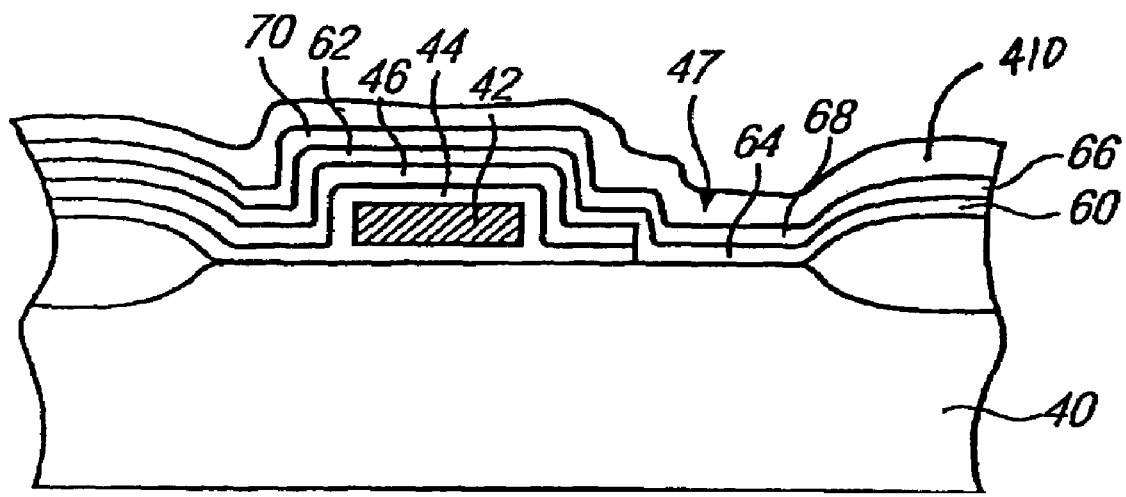
FIG. 4 is a cross-sectional view of the memory cell embodiment of FIG. 3E after formation of a control gate above the memory cell.

After the two oxide layers 48 and 56 are formed, a conductive word line (control gate) conductor 410 is formed thereabove in a conventional manner as shown in FIG. 4. The word line can be made of polysilicon or a metal, for example.

As used herein, the term "layer" can include sublayers, which themselves can be considered herein to constitute layers. Also as used herein, a "layer" may be patterned or unpatterned. By itself the term does not imply either condition. In addition, as used herein, layers which are termed "above" or "below" other layers, can in various embodiments be separated from such other layers by one or more intervening layers. The same interpretation is intended for layers being described as "superposing", "underlying" or "over" another layer.

Also as used herein, a particular patterned layer is "used as a mask" for a particular process step if it is the top layer present when the particular process step is performed, and also if it is only an intermediate layer present when the particular process step is performed, as long as any superposing layers are patterned the same as or more narrowly than the particular layer. In other words, as used herein, if the structure includes two patterned layers, then each of them individually, as well as both of them together, are all considered herein to act as a "mask" for the particular process step. The presence of a superposing layer having the same or narrower pattern as the particular layer does not prevent the particular layer from being "used as a mask" for the particular process step.

Also as used herein, no distinction is intended between the formation of a device or layer "on" or "in" a substrate or wafer. In some cases a device or layer is partially below the substrate surface and partially above the substrate surface, but in some cases the device or layer may be entirely below the surface or entirely above the surface. In all cases, as used herein, the device or layer is referred to equally as being "on" or "in" the substrate.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method of fabricating a floating gate memory cell on a wafer, comprising the steps of:
    forming a dielectric layer above a floating gate of the memory cell and in an oxide growth region not above a floating gate, the dielectric layer including a bottom oxide layer underlying a silicon nitride layer;
    removing the silicon nitride layer in the oxide growth region using a mask that covers the silicon nitride layer above the floating gate;
    removing the bottom oxide layer in the oxide growth region;
    forming a double oxide layer including the steps of
        forming a first oxide layer both above the floating sate and in the oxide growth region, employing an in-situ steam generation process for that formation; and
        forming a second oxide layer over the first oxide layer both above the floating gate and in the oxide growth region, employing a thermal oxidation process for that formation.

2. A method according to claim 1, wherein the step of removing the silicon nitride layer in the oxide growth region comprises the steps of:
    forming a photoresist over the silicon nitride layer;
    lithographically patterning the photoresist to remove the photoresist in the oxide growth region; and
    removing the silicon nitride layer using the photoresist as a mask.

3. A method according to claim 2, further comprising the step of removing the remaining photoresist before the step of removing the bottom oxide layer in the oxide growth region.

4. A method according to claim 1, wherein the step of removing the silicon nitride layer in the oxide growth region comprises the steps of:
    patterning a mask layer to expose the silicon nitride layer in the oxide growth region; and
    etching the silicon nitride layer using the mask layer as a mask.

5. A method according to claim 4, wherein the step of removing the bottom oxide layer in the oxide growth region comprises the steps of:
    removing the remaining photoresist to expose the silicon nitride layer above the floating gate; and
    wet etching the wafer.

6. A method according to claim 1, wherein the step of removing the bottom oxide layer in the oxide growth region comprises the step of wet etching the wafer.

7. A method according to claim 1, wherein the step of forming the first oxide layer comprises the step of heating the wafer to a temperature between 750 C. and 950 C. in a steam-containing atmosphere.

8. A method according to claim 1, further comprising the step of forming a control gate over the first and second oxide layers both above the floating gate and in the oxide growth region.

9. A method of fabricating a floating gate memory cell on a wafer, comprising the steps of:
    forming a dielectric layer above a floating gate of the memory cell and in an oxide growth region not above the floating gate, the dielectric layer including a bottom oxide layer underlying a silicon nitride layer;
    forming a photoresist both over the floating gate and in the oxide growth region over the silicon nitride layer;
    lithographically remove the photoresist in the oxide growth region;
    dry etching the silicon nitride layer using the photoresist as a mask;
    removing the remaining photoresist;
    wet etching the bottom oxide layer in the oxide growth region using the silicon nitride layer as a mask;
    forming a first oxide layer both above the floating gate and in the oxide growth region simultaneously, employing an in-situ steam generation process; and
    forming a second oxide layer over the first oxide layer both above the floating gate and in the oxide growth region simultaneously, employing a thermal oxidation process.

10. A method according to claim 9, wherein the step of forming a first oxide layer comprises the step of heating the wafer to a temperature between 750 C. and 950 C. in a steam-containing atmosphere.

11. A method according to claim 9, further comprising the step of forming a control gate both above the floating gate and in the oxide growth region.

* * * * *